United States Patent [19]

Scianna

[11] Patent Number: 4,607,350

[45] Date of Patent: Aug. 19, 1986

[54] STATIC MEMORY CELL

[75] Inventor: Cosimo Scianna, Munich, Fed. Rep. of Germany

[73] Assignee: Siemens Aktiengesellschaft, Berlin and Munich, Fed. Rep. of Germany

[21] Appl. No.: 446,253

[22] Filed: Dec. 2, 1982

[30] Foreign Application Priority Data

Dec. 3, 1981 [DE] Fed. Rep. of Germany ....... 3147951

[51] Int. Cl.⁴ ............................................. G11C 11/40
[52] U.S. Cl. .................................... 365/154; 365/190; 365/227
[58] Field of Search ................. 365/154, 190, 227, 95; 307/279

[56] References Cited

U.S. PATENT DOCUMENTS 4,096,584 6/1978 Owen, III et al. .................. 365/227
4,207,615 6/1980 Mar ..................................... 365/154
4,289,982 9/1981 Smith ................................... 365/95

FOREIGN PATENT DOCUMENTS 0113222 9/1979 Japan.

OTHER PUBLICATIONS

Dumbri et al., "Static RAMs with Microwatt Data Retention Capability", IEEE Journal of Solid State Circuits, vol. SC-15, No. 5, Oct. 1980, pp. 826-830.
Söll et al., "Digitale Speicher", Vogel Verlag, pp. 132-136.

Primary Examiner—James W. Moffitt
Assistant Examiner—Glenn A. Gossage
Attorney, Agent, or Firm—Herbert L. Lerner; Laurence A. Greenberg

[57] ABSTRACT

Static memory cell, including two fed-back inverters each having a switching transistor having drain, source and gate electrodes, a load element in the form of a depletion transistor having drain, source and gate electrodes, an output node connected to the drain electrode of the switching transistor and the gate electrode of the depletion transistor, and an additional potential source connected between the output node and the source electrode of the depletion transistor.

5 Claims, 4 Drawing Figures

STATIC MEMORY CELL

The invention relates to a static memory cell having two fed-back inverters, in which each inverter is formed of switching transistor and a load element in the form of a depletion-type transistor.

Such random-access memories (RAMs) which are also called "depletion load" memory cells and are manufactured in MOS technology, are known, for instance, from the publication by W. Söll and J.-H. Kirchner, "Digitale Speicher" (Digital Memories), Vogel-Verlag, 1978, Pages 132 and 133. The current consumption of such static RAMs is to be kept small especially in standby operation. However, because of the accordingly necessary large load elements, this requires a considerable increase of the area required for a memory cell. Low current consumption is also important particularly if the information of the RAM cells is to be preserved even in the event of a brief network failure, and for this reason the cells are supplied during the line failure from an external capacitor.

To reduce the power consumption of static RAM cells, it is known from IEEE Journal of Solid-State Circuits, Vol. SC-15, No. 5, October 1980, Pages 826 to 830, to construct the load elements as undoped polysilicon resistors. This, however, requires additional technological steps in the manufacture of the RAM cells.

It is accordingly an object of the invention to provide a static memory cell which overcomes the hereinafore-mentioned disadvantages of the heretofore-known devices of this general type, and which has a low dissipation loss while the area required is small.

With the foregoing and other objects in view there is provided, in accordance with the invention, a static memory cell, comprising two fed-back inverters each including a switching transistor having drain, source and gate electrodes, a load element in the form of a depletion transistor having drain, source and gate electrodes, an output node connected to the drain electrode of the switching transistor and the gate electrode of the depletion transistor, and an additional potential source connected between the output node and the source electrode of the depletion transistor. Due to the additional potential source which acts as a source bias, the cutoff voltage of the depletion transistor is changed, so that on one hand a shift of the so-called depletion curve and thus a current decrease is caused. On the other hand, the gate electrode of the depletion transistor becomes negative relative to the source electrode, so that the current decreases further.

In accordance with another feature of the invention, the additional potential sources are enhancement transistors each having gate and drain electrodes connected together.

In accordance with a further feature of the invention, the enhancement transistors each form voltages between the drain and source electrodes thereof in the range between $V_{tEO}$ and $V_{x2}$, where: $V_{tEO}$ is the cutoff voltage of the enhancement transistor for a source voltage equal to zero; and $$V_{x2} = \frac{-(2T - F_D^2) - \sqrt{(2T - F_D^2)^2 - 4(T^2 - 2\phi_F F_D^2)}}{2},$$

$$T = V_{tDO} - F_D \sqrt{2\phi_F},$$

$F_D$ is the substrate control factor of a depletion transistor, and $\phi_F$ is the Fermi potential.

Other features which are considered as characteristic for the invention are set forth in the appended claims.

Although the invention is illustrated and described herein as embodied in a static memory cell, it is nevertheless not intended to be limited to the details shown, since various modifications and structural changes may be made therein without departing from the spirit of the invention and within the scope and range of equivalents of the claims.

The construction and method of the operation of the invention, however, together with additional objects and advantages thereof will be best understood from the following description of specific embodiments when read in connection with the accompanying drawings, in which.

Figure 1:
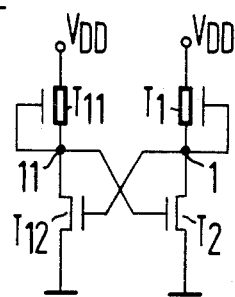
FIG. 1 is a schematic circuit diagram of a static memory cell according to the state of the art.

Referring now to the figures of the drawing in which like elements are provided with the same reference symbols, and first particularly to FIG. 1 thereof, there is seen a static memory cell according to the state of the art, which can be manufactured, for instance, in silicon gate depletion-mode technology. The memory cell includes a first inverter formed of a depletion transistor T1 and a switching transistor T2 of the enhancement type, as well as a second inverter which is formed analogously to the first inverter, of a depletion transistor T11 and a switching transistor T12. The drain electrode of the depletion transistor T1 is connected to a supply voltage $V_{DD}$. The source electrode and the gate electrode of the depletion transistor T1 are connected to the drain electrode of the switching transistor T2 at an output node 1. The source electrode of the switching transistor T2 is connected to ground. The same connections apply to the second inverter formed by the transistors T11 and T12.

Through the crosswise connection of the gate and drain terminals of the switching transistors T2 and T12, the operation of a flip-flop with two stable operating states is obtained, in a manner which is known per se.

The current flowing through a depletion transistor T1 operated in saturation is calculated as follows:

$$I_D = \frac{1}{2} K_D \frac{W_D}{L_D} (V_{GS} - V_{tD})^2 \tag{1}$$

where:

$K_D$: Depletion control factor (geometry and material-dependent constant);
$W_D$: Channel width of the depletion transistor;
$L_D$: Channel length of the depletion transistor;
$V_{GS}$: Gate-source voltage; and
$V_{tD}$: Cutoff voltage of the depletion transistor.

The cutoff voltage $V_{tD}$ of the depletion transistor T1 depends on the source voltage $V_x$, i.e., the voltage present between the source and the substrate, as follows (it is assumed that $V_{BB}=0$, i.e., the substrate is connected to ground):

$$V_{tD} = V_{tDO} + F_D(\sqrt{V_x + 2\phi_F} - \sqrt{2\phi_F})$$

where: $V_{tDO}$: Cutoff voltage of the depletion transistor for the source voltage 0;

$F_D$: Substrate control factor of the depletion transistor; and $\phi_F$: Fermi potential.

Figure 2:
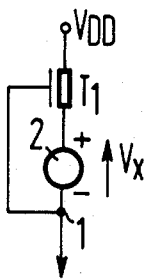
FIG. 2 is a schematic circuit diagram of the circuitry of the additional potential source according to the invention.

If the current is to be reduced by lengthening the channel length, long transistors are required, which makes a larger area necessary. If, however, according to the invention as shown in FIG. 2, an additional potential source 2 with the potential $V_x$ is connected between the source electrode of the depletion transistor T1 and the output node 1, the source 2 being poled according to the depletion transistor T1, i.e., if it is poled positive toward the source electrode of the depletion transistor T1 for n-channel technology, the cutoff voltage $V_{tD}$ becomes more positive and the gate voltage $V_{GS}$ becomes more negative, so that in accordance with equation (1), the current is reduced in two ways.

Figure 3:
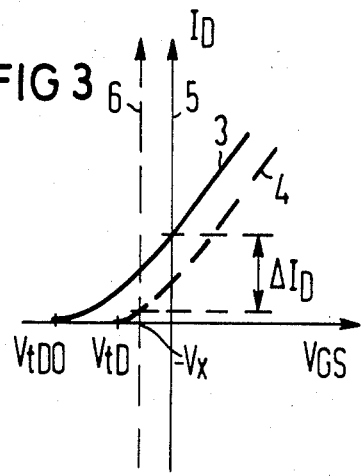
FIG. 3 is a graph showing the shift of the depletion curve obtained according to the invention.

This condition is illustrated in FIG. 3, which shows the depletion curve, i.e. the dependence of the current $I_D$ on the gate-source voltage $V_{GS}$. The additional potential $V_x$ has two effects which are cumulative: Firstly, it changes with the source bias, the cutoff voltage $V_{tDO}$ which causes a shift of the depletion curve to the right (from curves 3 to 4) and therefore causes a current reduction.

Secondly, the gate becomes negative relative to the source and the ordinate axis is therefore shifted to the left (from axes 5 to 6) so that the current $I_D$ decreases further. The total change of the current $I_D$ caused by the additional potential source $V_x$ is designated with reference symbol $\Delta I_D$.

Figure 4:
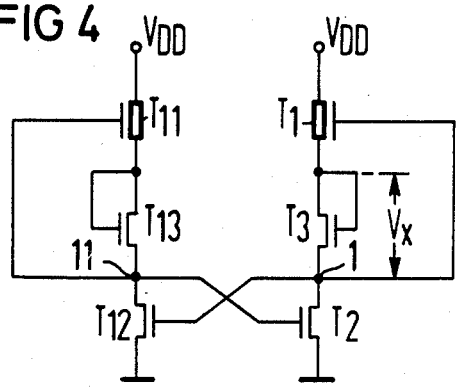
FIG. 4 is a schematic circuit diagram of an embodiment of a memory cell according to the invention.

Any desired voltage source can be used as the additional potential source $V_x$, such as a battery. Since it is economically advantageous and technologically simple, the additional voltage drop can be provided in such a manner that, as shown in FIG. 4, an enhancement transistor T3, having a gate electrode which is connected to its drain electrode, is connected between the output node 1 and the transistor T1 of the first inverter formed of the transistors T1 and T2. Similarly, an enhancement transistor T13 is connected between the output node 11 of the second inverter formed of the transistors T11 and T12 and the source electrode of the transistor T11.

In order for the conductivity of the depletion transistor T1 or the depletion transistor T11, respectively, to always be ensured, $$V_{tD}+V_x<0,$$

i.e. it must be smaller than zero. The solution of this inequality furnishes:

$$V_x<V_{x2} \tag{2}$$

where:

$$V_{x2} = \frac{-(2T - F_D^2) - \sqrt{(2T - F_D^2)^2 - 4(T^2 - 2\phi_F F_D^2)}}{2}$$

and $$T = V_{tDO} - F_D\sqrt{2\phi_F}$$

If the voltage drop $V_x$, as is shown in FIG. 4, is replaced by an enhancement transistor T3 or T13, respectively, the following applies for T3:

$$I_E = \frac{1}{2} K_E \frac{W_E}{L_E} (V_x - V_{tE})^2 \tag{3}$$

where:

$I_E$: Current through the enhancement transistor;
$K_E$: Control factor of the enhancement transistor;
$W_E$: Channel width of the enhancement transistor;
$L_E$: Channel length of the enhancement transistor; and
$V_{tE}$: Cutoff voltage of the enhancement transistor.

If the switching transistor T2 is cut off, care must be taken to see that the voltage $V_x$ at the enhancement transistor T3, which corresponds approximately to the cutoff voltage $V_{tE}$, fulfills the inequality (2):

$$V_{tE}=V_x<V_{x2}.$$

If the switching transistor T2 becomes conducting, we have $$V_x \geq V_{tE} \approx V_{tEO}$$

where the residual voltage at the switching transistor T2 is ignored and $V_{tEO}$ signifies the cutoff voltage of the enhancement transistor for the source voltage zero.

The following limits are then obtained as the limits to be observed in the construction of the enhancement transistor T3 for the voltage $V_x$ or the drain-source voltage, respectively, of the transistor T3:

$$V_{tEO}<V_x<V_{x2} \tag{8}$$

In detail, the transistors T1 and T3 as well as T11 and T13, respectively, can be constructed as follows: For the given current I which can flow into the cell the following applies:

$$I=I_D=I_E.$$

If, for instance, the same channel widths ($W=W_D=W_E$) are assumed for the transistors T1 and T3, the lengths of the transistors can be derived as follows from equations (1) and (3):

$$L_D = \frac{1}{2} K_D \frac{W}{I} (-V_x - V_{tD})^2 \tag{6}$$

$$L_E = \frac{1}{2} K_E \frac{W}{I} (V_x - V_{tE})^2 \tag{7}$$

An optimum length combination of $L_D$ (the channel length of T1) and $L_E$ (the channel length of T3) furnishes a minimum total length L, where $L=L_D+L_E$. For this minimum length L, the corresponding voltage $V_x$ is now sought (within the above-mentioned limits). The voltage $V_x$ fulfills the following equation:

$$\frac{\partial L}{\partial V_x} = 0$$

$$\frac{\partial L}{\partial V_x} = K_D \frac{W}{l}[-V_x - V_{tDO} - F_D(\sqrt{V_x + 2\phi_F} - \sqrt{2\phi_F})]\cdot$$
$$[-1 - \tfrac{1}{2}F_D(V_x + 2\phi_F)^{-\tfrac{1}{2}}] + K_E \frac{W}{l}(V_x - V_{tE}).$$

By setting this equal to zero the following is obtained:

$$K_D[-V_x - V_{tDO} - F_D(\sqrt{V_x + 2\phi_F} - \sqrt{2\phi_F})]\cdot$$
$$[-1 - \tfrac{1}{2}F_D(V_x + 2\phi_F)^{-\tfrac{1}{2}}] + K_E(V_x - V_{tE}) = 0$$

Sorting by powers furnishes:

$$\frac{AV_x + B}{CV_x + D} = \sqrt{V_x + 2\phi_F} \quad (5)$$

where:

$$A = 3/2\, F_D K_D, \quad B = \tfrac{1}{2}K_D F_D(4\phi_F + V_{tDO} - F_D\sqrt{2\phi_F}),$$

$$C = K_D + K_E, \quad D = K_D(V_{tDO} - F_D\sqrt{2\phi_F} + \tfrac{1}{2}F_D^2) - K_E V_{tE}$$

By interpolation of this curve (5) within the above-mentioned limits (equation 8), it can be determined that it tends toward zero and the corresponding $V_x$-value is a minimum for L.

Through equations (6) and (7), this value determines the two lengths $L_D$, $L_E$ and is independent of the current which flows through the branch as well as of the width W if it is chosen the same for both transistors. The channel width of both transistors can, of course, also be chosen different. The following is an example of a structure in NMOS silicon gate depletion-mode technology:

I = 10 μA  p1 $V_{tDO}$ = −3.7 V
$K_D$ = 30 μA/V²
$V_{tEO}$ = 0.7 V
$K_E$ = 36 μA/V²
$F_D$ = 0.4 V^{½}
$2\phi_F$ = 0.7 V
$V_x$ limit values: 0.7 to 3.22 V $V_x$ = 1.944 V $L_D$ = 10.77 → 11 μm    $W_D$ = 5 μm -continued $L_E$ = 15.07 → 15 μm    $W_E$ = 5 μm $L_D + L_E$ = 26 μm In order to limit the current to 10 μA through a depletion transistor T1 operated in saturation according to FIG. 1 (state of the art), the channel of the transistor T1, on the other hand, must be made 103 μm long, i.e. longer by approximately a factor of 4.

I claim:

1. Static memory cell, comprising a bistable multivibrator including two cross-coupled fed-back inverters each including a switching transistor having drain, source and gate electrodes, a load element in the form of a depletion transistor having drain, source and gate electrodes, a supply potential source connected to the drain electrode of said depletion transistor, an output node connected to the drain electrode of the switching transistor and the gate electrode of the depletion transistor, and an additional circuit element providing a voltage drop connected between said output node and the source electrode of said depletion transistor.

2. Memory cell according to claim 1, wherein said additional circuit element is an enhancement transistor having gate and drain electrodes connected together.

3. Memory cell according to claim 2, wherein said enhancement transistor forms a voltage between the drain and source electrodes thereof in the range between $V_{tEO}$ and $V_{x2Y}$, where: $V_{tEO}$ is the cutoff voltage of said enhancement transistor for a source voltage equal to zero; and $$V_{x2} = \frac{-(2T - F_D^2) - \sqrt{(2T - F_D^2)^2 - 4(T^2 - 2\phi_F F_D^2)}}{2},$$

where $$T = V_{tDO} - F_D\sqrt{2\phi_F},$$

$F_D$ is the substrate control factor of a depletion transistor,
$\phi_F$ is the Fermi potential and
$V_{tDO}$ is the cutoff voltage of said depletion transistor for source voltage 0.

4. Memory cell according to claim 1, wherein the gate electrode of each respective switching transistor is connected to the drain electrode of the other switching transistor forming said bistable multivibrator.

5. Memory cell according to claim 1 wherein the gate electrodes of the depletion transistors are negatively biased with respect to the source electrodes there of.

* * * * *